(12) United States Patent
Chong et al.

(10) Patent No.: US 6,362,438 B1
(45) Date of Patent: Mar. 26, 2002

(54) ENHANCED PLATED-THROUGH HOLE AND VIA CONTACT DESIGN

(75) Inventors: Tee Onn Chong, Chandler; Chris Baldwin, Tempe; Chee-Yee Chung, Chandler, all of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/461,901

(22) Filed: Dec. 15, 1999

(51) Int. Cl.[7] .................................................. H05K 1/11
(52) U.S. Cl. ........................ 174/262; 174/264; 361/792
(58) Field of Search ................................. 174/262, 263, 174/264, 265, 266; 257/698, 774; 361/793, 794, 795, 796, 803

(56) References Cited

U.S. PATENT DOCUMENTS

| | | | | |
|---|---|---|---|---|
| 4,791,248 A | * | 12/1988 | Oldenettel ................. | 174/68.5 |
| 5,424,245 A | * | 6/1995 | Gurtler et al. .............. | 437/183 |
| 5,436,412 A | * | 7/1995 | Ahmad et al. .............. | 174/265 |
| 5,734,560 A | * | 3/1998 | Kamperman et al. ....... | 361/774 |
| 6,010,769 A | * | 1/2000 | Sasaoka et al. ............. | 428/209 |
| 6,013,948 A | * | 1/2000 | Akram et al. ............... | 257/698 |
| 6,136,419 A | * | 10/2000 | Fasano et al. .............. | 428/210 |
| 6,225,692 B1 | * | 5/2001 | Hinds .......................... | 257/698 |

\* cited by examiner

Primary Examiner—Jeffrey Gaffin
Assistant Examiner—Jose H. Alcala
(74) Attorney, Agent, or Firm—Schwegman, Lundberg, Woessner & Kluth, P.A.

(57) ABSTRACT

The present invention provides a circuit board with a plated-through hole, wherein a first end of the plated-through hole is electrically attached to a cap formed of conductive material. One or more surface pads terminate on a surface layer of the printed circuit board, and are connected to the cap by one or more vias extending from the cap to the one or more surface pads. In some embodiments, the circuit board is a substrate for mounting an integrated circuit, such as a ball-grid array integrated circuit. The invention includes methods for making the novel circuit board, as well as integrated circuit assemblies comprising the novel circuit board with an integrated circuit mounted thereto.

13 Claims, 3 Drawing Sheets

ENHANCED PLATED-THROUGH HOLE AND VIA CONTACT DESIGN

FIELD OF THE INVENTION

The invention relates generally to electronic circuit board design, and more specifically to an enhanced plated-through hole design to facilitate high-performance and high-density connection.

BACKGROUND OF THE INVENTION

Electronic circuits are typically constructed of electronic components that are mounted to a circuit board. The circuit board not only physically holds the electronic components, but also provides the electrical connections between the various components of the circuit. Because the circuit board therefore comprises a part of the circuit, its electrical characteristics must be considered in designing and laying out a circuit. Also, the desire to reduce the physical size of electronics devices must be considered in designing a circuit board, such that the electronic components and electrical connections between them take as little space as is possible.

Circuit boards found in modern electronic devices are typically boards that resemble a sandwich of insulating layers with conductors sandwiched in the space between. The conductors are often traces of copper that are relatively flat and therefore efficiently sandwiched in the space between insulating layers. The electrical components of the circuit are connected to the various traces sandwiched between or mounted on the insulating layers. Because the components can only be connected to metal pads on the circuit board, the circuit is constructed mainly by connection of components to metal pads on the exposed surfaces of the circuit board, and by interconnection of these component connections to circuit traces sandwiched between layers of the circuit board.

These connections between circuit board layers are often made by what is commonly known as a plated-through hole. A plated-through hole comprises a hole that extends through at least a portion of the circuit board, and between at least two layers of conductive traces. The hole is positioned between conductive traces on two or more layers of the circuit board, and is plated or coated with a conductive material. The conductive material electrically connects the conductive traces on the layers of the circuit board that the hole is positioned between, and forms a part of the circuit.

Plated-through holes therefore provide a way of connecting sandwiched layers of a circuit board to electronic components that are mounted to the exposed surfaces of a printed circuit board. Also, plated-through holes can provide connection to leaded electrical components whose leads or pins are placed into plated-through holes that extend through the circuit board. Although plated-through holes that extend to the surfaces of a circuit board can receive leads or pins of electrical components, the size of these plated-through holes is large relative to the electrical connector density of many modern surface-mount electrical components.

Plated-through holes that are used to provide electrical connection to surface mount components must further provide electronic contact pads on an exposed surface of the circuit board to which the electrical components can be connected. The plated-through holes are typically not routed to the surface of a circuit board in such circuit boards, but are connected to surface pads by a number of vias extending to another layer of the circuit board at which point they are connected to pads adjacent to the plated-through hole. Such circuit board construction takes space, from the plated-through hole layer to the surface layer, of whatever adjacent pads are necessary to provide connection to surface pads, and so takes a large area of the circuit board for a relatively small number of electrical connections. In addition to routing compactness, the inductance of such circuit boards is higher than is desirable, and other electrical characteristics such as resistance suffer. What is needed is a plated-through hole design that is more compact and has more favorable electrical characteristics such as inductance.

SUMMARY OF THE INVENTION

The present invention provides a circuit board with a plated-through hole, wherein a first end of the plated-through hole is electrically attached to a cap formed of conductive material. One or more surface pads terminate on a surface layer of the printed circuit board, and are connected to the cap by one or more vias extending from the cap to the one or more surface pads. In some embodiments, the circuit board is a substrate for mounting an integrated circuit, such as a ball-grid array integrated circuit.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

Because existing circuit board technology provides a plated-through hole contact configuration that is not as efficient as is desired with respect to conservation of space or in electrical performance, an improved plated-through hole technology is desired. Specifically, a technology providing the same function while using less circuit board space and that operates at a lower inductance than existing technology is desired, to enable more dense connection of higher performance electrical components.

Figure 1:
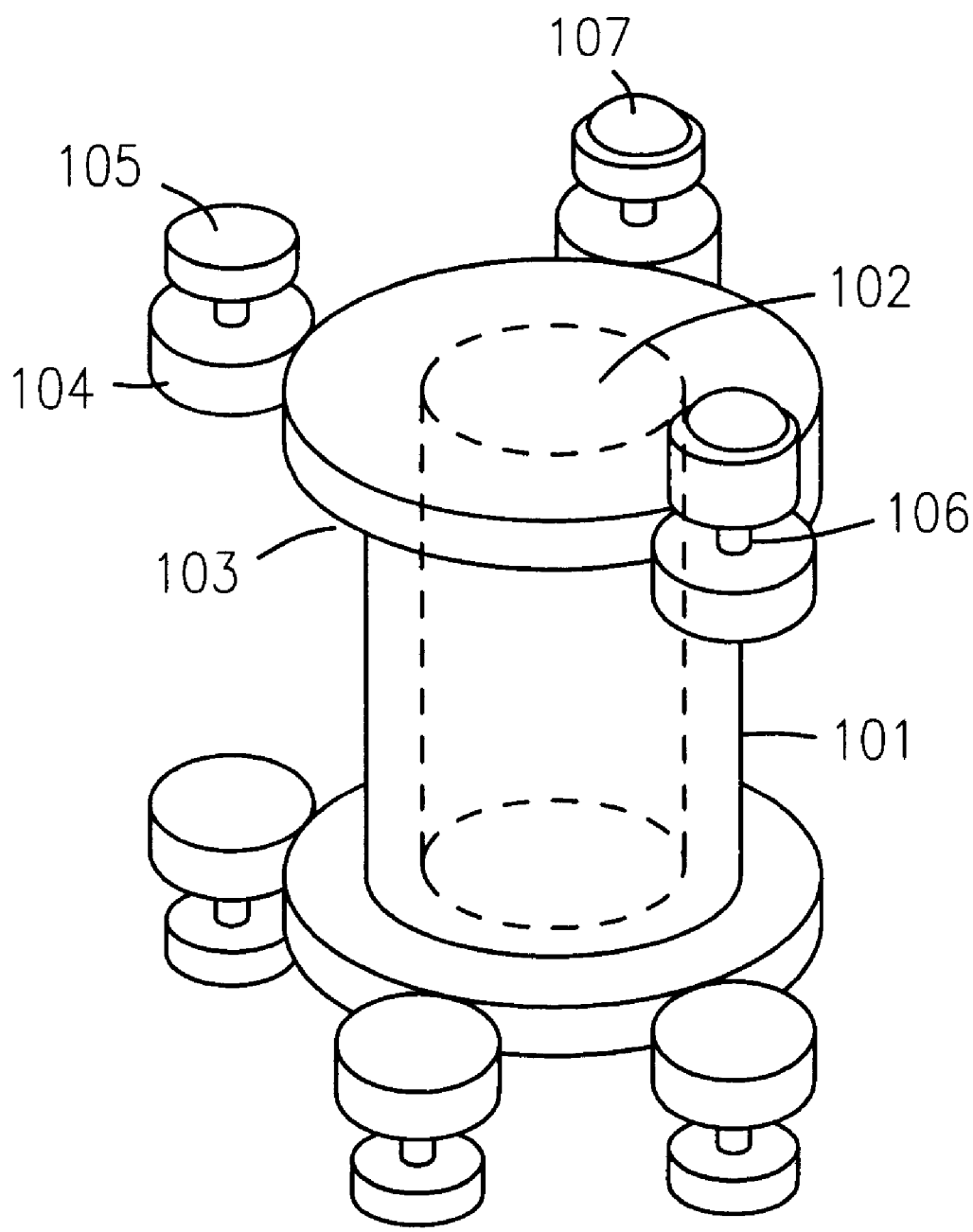
FIG. 1 shows a plated-through hole assembly providing electrical connection to surface consistent with the prior art.

FIG. 1 illustrates a plated-through hole 101 as would be embedded in a multi-layer circuit board, consistent with the prior art. The plated-through hole may be filled with a filler 102, which extends through the plated through hole and sometimes also through a corresponding opening in plated-through hole pad 103. Although a plated-through hole is a well-known feature in the art, it is unclear whether the definition a plated-through hole includes a plated-through hole pad at the end of the plated through hole. Therefore for purposes of this application, a plated-through hole is to be considered as a plated-through hole that in some embodiments includes a plated-through hole pad and in alternate embodiments does not. Both embodiments of a plated-through hole are to be considered consistent with the present invention.

At least one adjacent pad 104 is located adjacent to and connected to the plated-through hole pad 103, and is on the same circuit board layer as the plated-through hole pad. At least one surface pad 105 is located on a surface layer of the circuit board, such that each surface pad corresponds to an adjacent pad on an internal layer. The surface pads 105 are connected to the adjacent pads 104 by vias 106, which extend between layers of the circuit board. In some assemblies, the surface pads 105 further have a solder ball 107 attached thereto, forming a part of a ball-grid array mount. Because the plated-through hole, pads and vias are made of conductive material, they form an electrical connection that can be used to connect electronic components.

Figure 2:
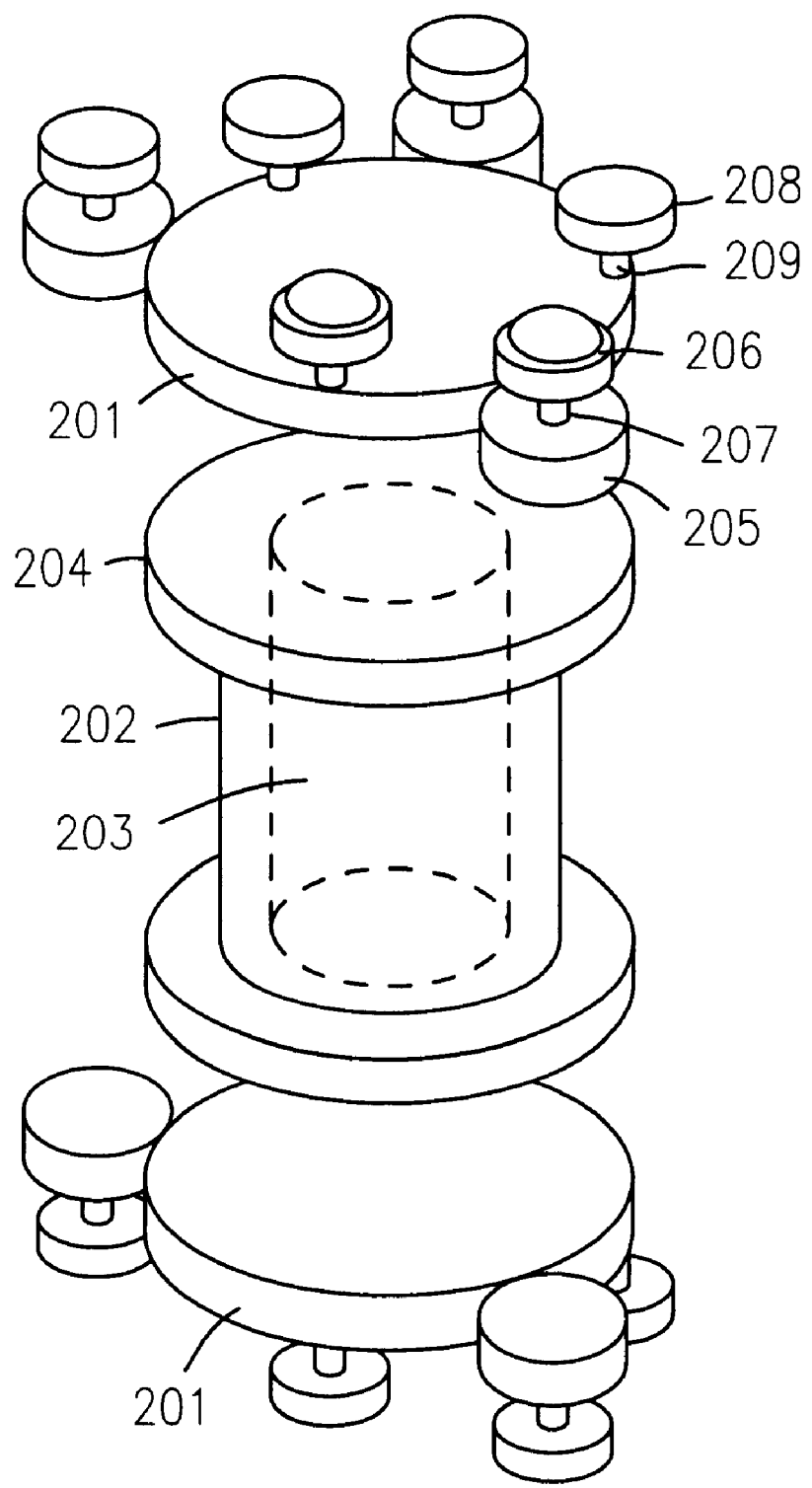
FIG. 2 shows a plated-through hole assembly with a cap, consistent with an embodiment of the present invention.

The present invention improves upon the assembly of FIG. 1 by providing at least one cap 201 that is attached to an end of the plated-through hole, and is formed of a conductive material. The plated-through hole 202 is in some embodiments of the invention filled, such as with a nonconductive polymer material 203. The cap 201, which in FIG. 2 is shown detached from the plated-through hole pad for clarity, may be attached to plated-through hole pad in some embodiments, or may attach directly to the plated-through hole with no plated-through hole pad in alternate embodiments. At least one adjacent pad 205 is attached to and adjacent on the same circuit board layer to the cap 201. Corresponding surface pads 206 are located on a surface of the circuit board in a position corresponding to the location of the adjacent pads, and are connected to the adjacent pads by vias 207. The plated-through hole, pads, and vias are formed of conductive material, and are used in an assembly such as that of FIG. 2 to provide electrical connection between components of a circuit.

The assembly of FIG. 2 further comprises at least one via extending from the cap 201 to one or more surface pads 208 located in a position corresponding to the cap 201. The surface pads 208 are connected to the cap by vias 209, and provide the ability to connect surface pads corresponding to the plated-through hole location to the plated-through hole. This allows conservation of space by not requiring adjacent pads and corresponding surface pads where only a few connections are needed, and provides the ability to make a greater number of connections in a given amount of space on a circuit board.

Figure 3:
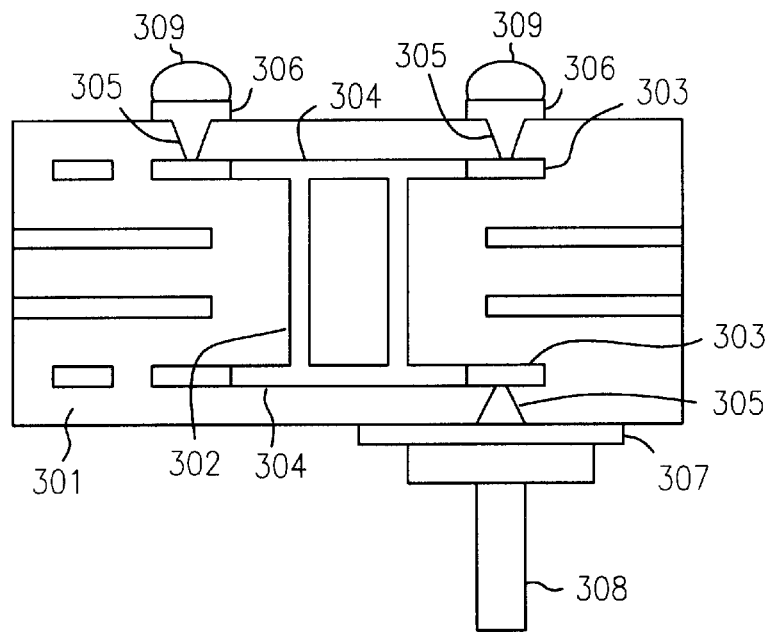
FIG. 3 shows a plated-through hole assembly in a circuit board, consistent with the prior art.

FIG. 3 shows a side view of an embodiment of the prior art, in which a ball-grid array of solder balls on one side of a mounting substrate is connected to pins of a pin-grid array on the opposite side of the substrate. Such a substrate is commonly used to package integrated circuit dice, such that a die is mounted to the substrate by the ball-grid array and is sealed, and the pin-grid array on the other side of the substrate provides electrical connection of the integrated circuit assembly to a socket or circuit board.

Circuit board 301 has within it plated-through hole 302, which has a number of adjacent pads 303 located adjacent to and on the same layer as plated-through hole pads 304. The adjacent pads are connected by vias 305 to surface pads 306, which are ball-grid array pads, or to surface pads 307 which are attached to pins 308. An integrated circuit is to be mounted to the solder balls 309 attached to surface pads 306, and sealed to the circuit board substrate 301. Pins 308 provide electrical connection and in some embodiments physical connection of the integrated circuit-substrate assembly to a circuit.

Figure 4:
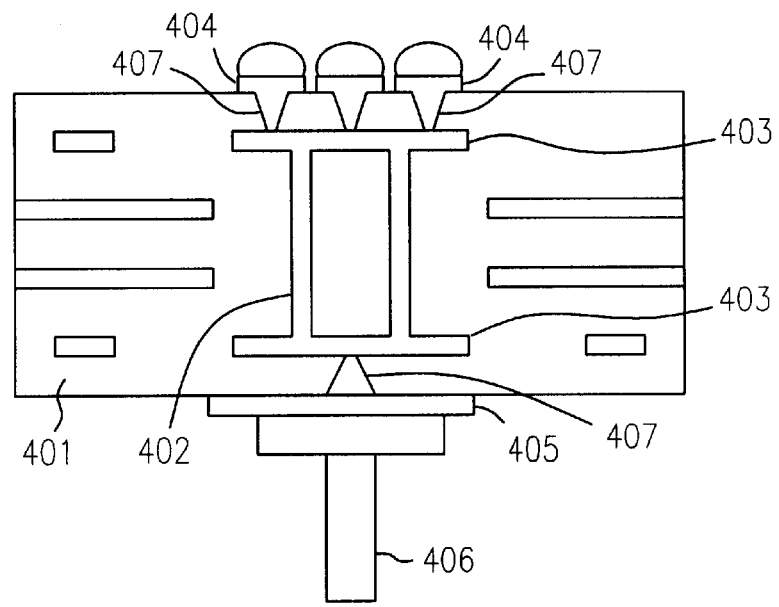
FIG. 4 shows a plated-through hole assembly with a cap in a circuit board, consistent with the present invention.

FIG. 4 shows the inventive plated-through hole connection, which requires reduced circuit board area and improved electrical performance. The circuit board substrate 401 has within it a plated-through hole 402 that features a cap 403 on each end. One surface of the substrate has a number of surface pads 404 which are ball-grid array pads, used to mount an integrated circuit die to the substrate. Vias 407 connect the surface pads to the caps on the ends of the plated-through hole. The opposite surface of the substrate has a surface pad 405 to which a pin 406 of a pin-grid array is attached. The pins provide connection of the integrated circuit-substrate assembly to an electronic circuit.

Once again, a plated-through hole for purposes of this invention includes in some embodiments at least one plated-through hole pad and in alternate embodiments does not include such a pad. Both embodiments are to be considered within the scope of the term "plated-through hole", and are within the scope of the invention.

The novel assembly of FIG. 4 requires in the configuration shown approximately 10% less circuit board area than the prior art assembly of FIG. 3. Varying circuit board processes and geometries and varying numbers of connections to each plated-through hole will influence the area savings illustrated by these figures. Further, the inventive assembly of FIG. 4 in one exemplary substrate process and geometry results in an estimated inductance of 11.5 picoHenries for the ball-to-pin connection of FIG. 3, and only 2.6 picoHenries for the ball-to-pin connection of FIG. 4. The reduced inductance is due in part to the increased number of circuit paths with no increase in required circuit board area, and by reducing the distance for current flow. As such, other electrical parameters such as resistance are also positively affected by the configuration of the present invention. Again, inductances and other electrical parameters will vary by manufacturing process and geometry, and the above is only an example of one configuration contemplated by the inventors.

Because the invention provides improved inductance and more efficient use of circuit board space than the prior art, the invention is particularly desirable for high-density and high-speed connections such as those used in microprocessors or other high-speed digital circuits. The invention may be further applied to high-performance analog circuits, or any other electrical circuit where its unique features are desired. It is anticipated that the invention may be adapted to applications other than those described here as examples, and these other applications should be considered within the scope of the invention.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the fall scope of equivalents thereof.

We claim:
1. A circuit board, comprising:
   a plated-through hole;
   a cap, formed of a conductive material and electrically attached to a first end of the plated-through hole;
   at least one surface pad terminating on a surface layer of the circuit board; and
   at least one via extending from the cap to the at least one surface pad.
2. The circuit board of claim 1, further comprising a solid material filling the plated-through hole.

3. The circuit board of claim 2, wherein the solid material is a nonconductive polymer.

4. The circuit board of claim 1, further comprising at least one adjacent conductive pad adjacent to and in contact with the cap.

5. The circuit board of claim 4, further comprising:
   at least one surface pad on a surface layer of the circuit board corresponding to but on a different circuit board layer as the at least one adjacent conductive pad; and
   at least one via extending from the at least one adjacent conductive pad to the at least one surface pads.

6. The circuit board of claim 1, wherein the circuit board is a flip-chip substrate.

7. The circuit board of claim 6, wherein the at least one surface pad is a solder bump pad.

8. The circuit board of claim 1, wherein the plated-through hole comprises a plated-through hole pad, and the plated-through hole pad portion of the plated-through hole is capped with a conductive material.

9. The circuit board of claim 1, further comprising:
   a second cap, formed of a conductive material and covering a second end of the plated-through hole;
   at least one second surface pad located on a second surface of the circuit board; and
   at least one via connecting the at least one second surface pad to the second cap covering the second end of the plated-through hole.

10. An integrated circuit assembly, comprising:
    an integrated circuit;
    a substrate;
    a plated-through hole embedded within the substrate;
    a cap, formed of a conductive pad attached to and capping a first end of the plated-through hole;
    at least one surface pad on a surface of the substrate; and
    at least one via extending from the cap to the at least one pad on the surface of the substrate.

11. The integrated circuit assembly of claim 10, further comprising:
    at least one adjacent conductive pad, adjacent to and in contact with the cap;
    at least one surface pad on a surface layer of the circuit board corresponding to but on a different circuit board layer as the at least one adjacent conductive pad; and
    at least one via extending from the at least one adjacent conductive pad to the at least one surface pad.

12. The integrated circuit assembly of claim 10, wherein the integrated circuit is a flip-chip integrated circuit and the substrate is a ball-grid array integrated circuit substrate.

13. The integrated circuit assembly of claim 10, wherein the integrated circuit is a flip-chip integrated circuit and the substrate is a pin-grid array integrated circuit substrate.

* * * * *